(12) United States Patent
Taylor

(10) Patent No.: US 6,936,839 B2
(45) Date of Patent: Aug. 30, 2005

(54) MONOLITHIC INTEGRATED CIRCUIT INCLUDING A WAVEGUIDE AND QUANTUM WELL INVERSION CHANNEL DEVICES AND A METHOD OF FABRICATING SAME

(75) Inventor: Geoff W. Taylor, Storrs-Mansfield, CT (US)

(73) Assignee: The University of Connecticut, Farmington, CT (US)

( * ) Notice: Subject to any disclaimer, the term of this patent is extended or adjusted under 35 U.S.C. 154(b) by 95 days.

(21) Appl. No.: 10/292,127

(22) Filed: Nov. 12, 2002

(65) Prior Publication Data

US 2003/0123829 A1 Jul. 3, 2003

Related U.S. Application Data

(63) Continuation-in-part of application No. 09/710,217, filed on Nov. 10, 2000, now abandoned, which is a continuation-in-part of application No. 08/949,504, filed on Oct. 14, 1997, now abandoned.
(60) Provisional application No. 60/028,576, filed on Oct. 16, 1996, now abandoned.

(51) Int. Cl.[7] .................... H01L 29/06; H01L 31/0328; H01L 31/0336; H01L 31/072; H01L 31/109
(52) U.S. Cl. ........................... 257/20; 257/21; 257/24; 257/184; 257/187; 257/192; 257/195; 257/197
(58) Field of Search .............................. 257/9, 12, 14, 257/20, 21, 24, 184, 187, 183, 192, 194, 195, 197, 198

(56) References Cited

U.S. PATENT DOCUMENTS

| 4,424,525 A | 1/1984 | Mimura ..................... 357/23 |
| 4,658,403 A | 4/1987 | Takiguchi et al. ............ 372/96 |
| 4,683,484 A | 7/1987 | Derkits, Jr. .................. 357/16 |
| 4,806,997 A | 2/1989 | Simmons et al. ............. 357/16 |
| 4,827,320 A | 5/1989 | Morkoc et al. ............... 357/22 |
| 4,899,200 A | 2/1990 | Shur et al. .................... 357/30 |

(Continued)

OTHER PUBLICATIONS

*Anodic–Oxide–Induced Intermixing in GaAs–AlGaAs Quantum–well and Quantum–Wire Structures* by Shu Yuan et al., IEEE Journal of Selected Topics in Quantum Electronics, vol. 4, No. 4, Jul./Aug. 1998.

(Continued)

Primary Examiner—Steven Loke
(74) Attorney, Agent, or Firm—Gordon & Jacobson, PC

(57) ABSTRACT

A family of optical waveguide structures and high speed optoelectronic/transistor devices are obtained from a multi-layer structure that includes a modulation doped quantum well structure formed over a DBR mirror. The optical waveguide structure is realized by implanting n-type ions to form a pair of n-type implant regions that define a waveguide region therebetween. An oxide layer (e.g., $SiO_2$) is deposited over the waveguide region. A thermal annealing operation causes the oxide layer to introduce impurity free vacancy disordering that substantially eliminates absorption in the waveguide region. The waveguide region contributes to lateral confinement of light therein. An etching operation etches through the n-type implant regions to define sidewalls, which are subject to an oxidation operation that produces oxidized sections along the sidewalls. The oxide layer is removed, and a top distributed bragg reflector mirror is formed over the waveguide region. The resulting structure realizes an optical waveguide. Optoelectronic devices (including lasers, detectors, modulators, amplifiers) and transistor devices (including enhancement-mode and depletion mode JFET devices and bipolar-type devices) are also realized from the same multi-layer structure and share many of the fabrication steps of the optical waveguide, to thereby provide for efficient monolithic integration of a broad array of optical/optoelectronic/electronic devices.

41 Claims, 11 Drawing Sheets

U.S. PATENT DOCUMENTS

| | | | |
|---|---|---|---|
| 4,949,350 A | 8/1990 | Jewell et al. | 372/45 |
| 5,010,374 A | 4/1991 | Cooke et al. | 357/16 |
| 5,105,248 A | 4/1992 | Burke et al. | 357/24 |
| 5,202,896 A | 4/1993 | Taylor | 372/50 |
| 5,337,328 A | 8/1994 | Lang et al. | 372/45 |
| 5,386,128 A | 1/1995 | Fossum et al. | 257/183.1 |
| 5,422,501 A | 6/1995 | Bayraktaroglu | 257/195 |
| 5,698,900 A | 12/1997 | Bozada et al. | 257/744 |
| 6,031,243 A | 2/2000 | Taylor | 257/13 |

OTHER PUBLICATIONS

*Characterization of Ga Out–diffusion from GaAs into $SiO_xN_y$ Films During Thermal Annealing* by Masaaki Kuzuhara et al., J. Appl. Phys. 66 (12), Dec. 15, 1989.

*Dual–Wavelength Laser by Selective Intermixing of GaAs/AlGaAs Quantum Wells* by D. Sun et al., Proc Spie, vol. 2683, p 2, 1996.

*GaAs/AlGaAs Photonic Integrated Circuits Fabricated Using Impurity–Free Vacancy Disordering* by J.H. Marsh et al. Proc. Of the SPIE, vol. 2401, p 74, 1995.

*Heterojunction Field–Effect Transistor (HFET)* by G.W. Taylor et al., Electronics Letters, vol. 22, No. 15, pp. 784–786, Jul. 17, 1986.

*High Temperature Annealing of Modulation Doped GaAs/AlGaAs Heterostructures for FET Applications* by H. Lee et al., 1983 IEEE/Cornell Conf. On High–Speed Semiconductor Devices & Ckts, Aug. 1983.

*Selective Quantum–Well Intermixing in GaAs–AlGaAs Structures Using Impurity–Free Vacancy Diffusion* By Boon Siew Ooi et al., IEEE Journal of Quantum Electronics, vol. 33, No. 10, p 1784, Oct. 1997.

*Semiconductor Lasers Using Diffused Quantum–Well Structures* by S.–F. Yu et al., IEEE Journal of Selected Topics in Quantum Electronics, vol. 4, No. 4 Jul./Aug. 1998.

*Submicrometre Gate Length Scaling of Inversion Channel Heterojunction Field Effect Transistor* by P.A. Kiely et al., Electronics Letters, vol. 30, No. 6, Mar. 17, 1994.

*Theoretical and Experimental Results for the Inversion Channel Heterostructure Field Effect Transistor* by G.W. Taylor et al., IEE Proceedings–G, vol 140, No. 6, Dec. 1993.

*Very Low Loss Extended Cavity GaAs/AlGaAs Laser Made by Impurity–Free Vacancy Diffusion* by I. Gontijo et al., Electronics Letters, vol. 30, No. 2, Jan. 20, 1994.

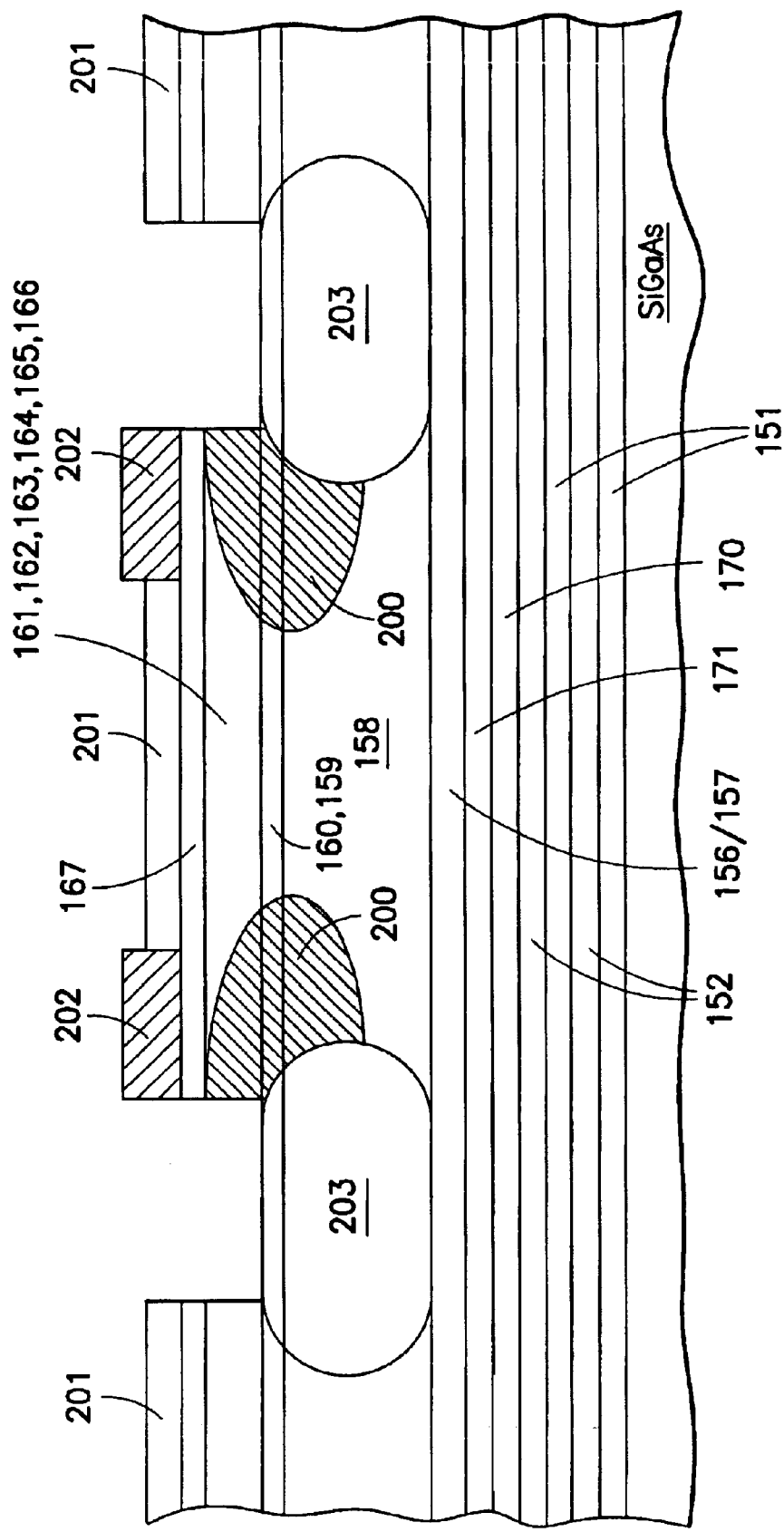

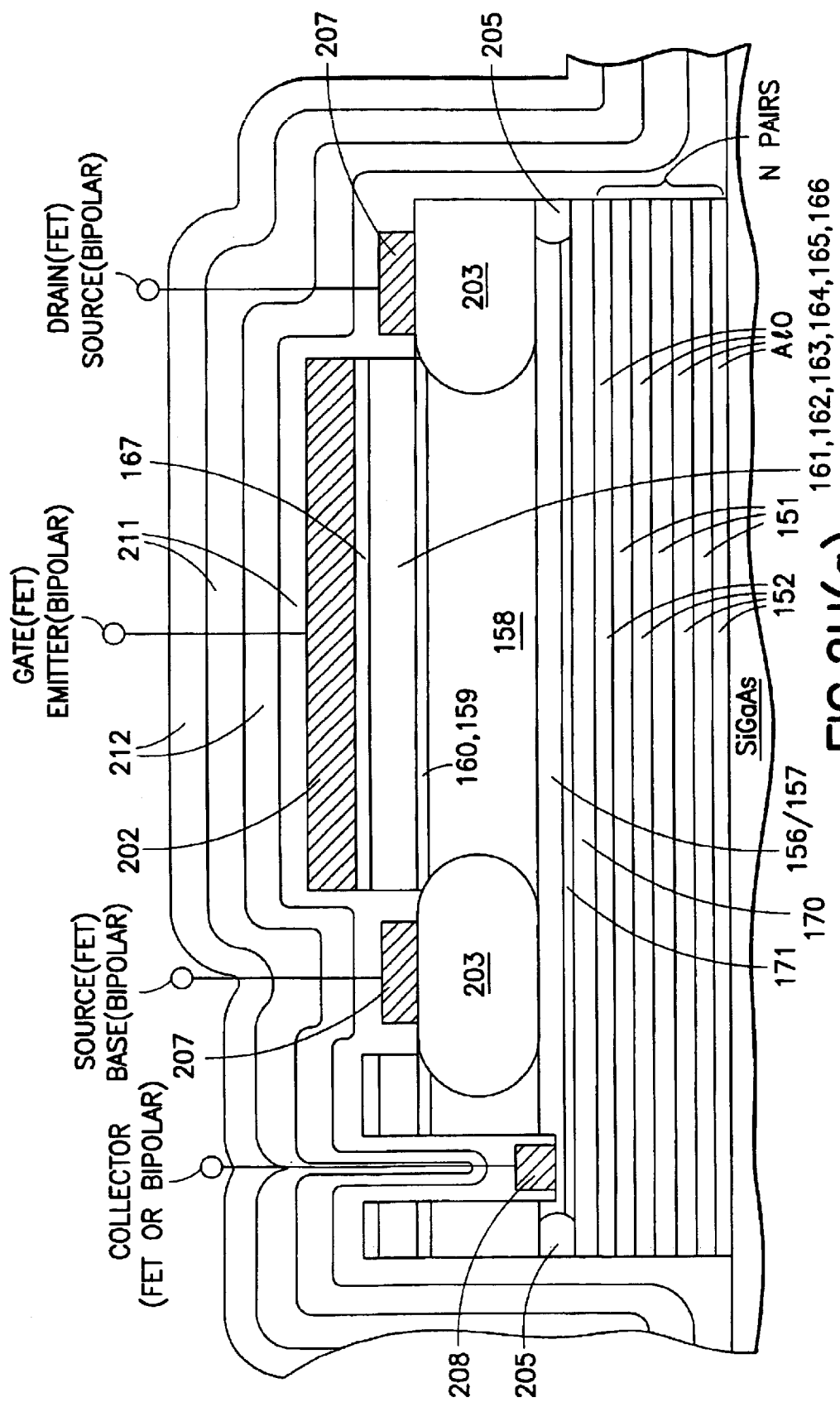

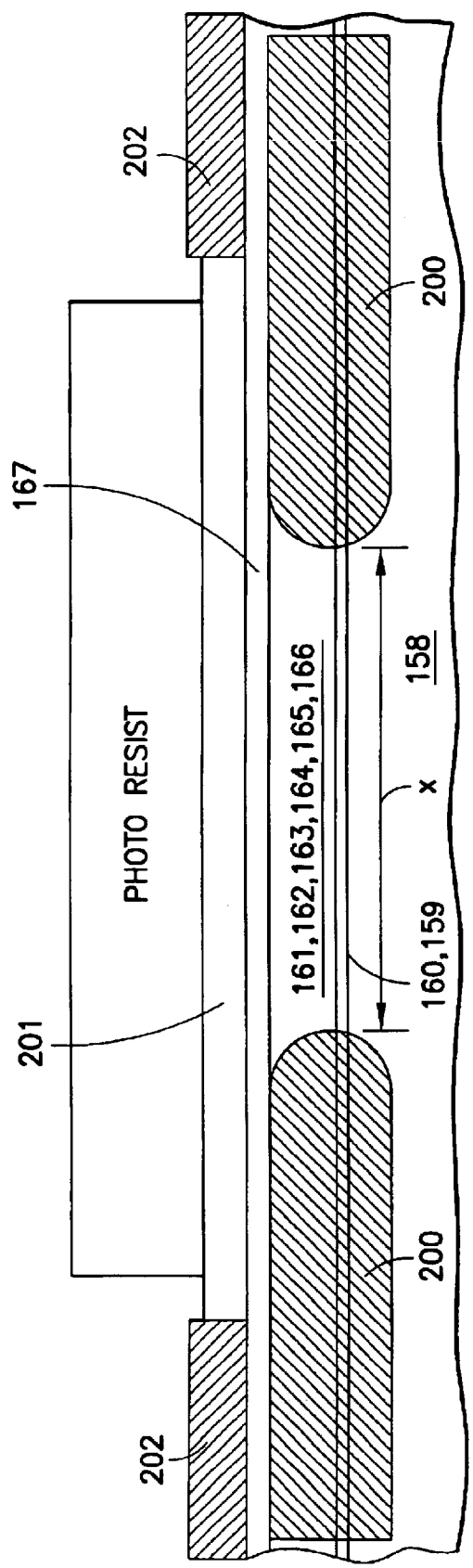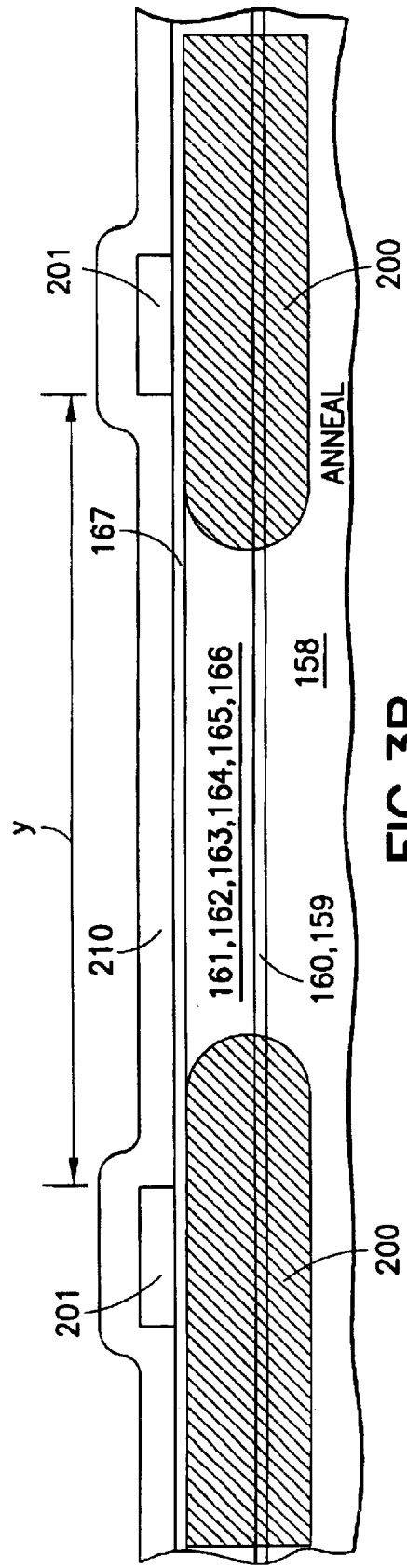
FIG.3A
FIG.3B

MONOLITHIC INTEGRATED CIRCUIT INCLUDING A WAVEGUIDE AND QUANTUM WELL INVERSION CHANNEL DEVICES AND A METHOD OF FABRICATING SAME

CROSS REFERENCE TO RELATED APPLICATIONS

This application is a continuation-in-part of U.S. application Ser. No. 09/710,217, filed on Nov. 10, 2000, now abandoned, which is a continuation-in-part of application Ser. No. 08/949,504 entitled "An Apparatus and a Method of Fabricating Inversion Channel Devices with Precision Gate Doping for a Monolithic Integrated Circuit, filed on Oct. 14, 1997, now abandoned in the name of G. W. Taylor which in turn was a continuation of provisional application 60/028,576 filed on Oct. 16, 1996, abandoned all of which are incorporated herein by reference.

BACKGROUND OF THE INVENTION

1. Field of the Invention

This invention relates to the field of semiconductor heterojunction devices and, in particular, to transistors, optical emitters, optical detectors, optical modulators, optical amplifiers and other optoelectronic devices utilizing an inversion channel created by modulation doping.

2. State of the Art

This invention builds upon the existing device structure known as the Pseudomorphic Pulsed Doped High Electron Mobility Transistor (Pulsed Doped PHEMT) and sometimes referred to as the Pulsed Doped Modulation Doped Field Effect Transistor (Pulsed Doped MODFET) or the Pulsed Doped Two Dimensional Gas Field Effect Transistor(Pulsed Doped TEGFET). GaAs/InGaAs/$Al_xGa_{1-x}As$ is the III–V material system of choice for these devices because of the ability to grow high optical/electrical quality epitaxial layers by MBE (molecular beam epitaxy). These high frequency transistors are now in constant demand as the front end amplifier in wireless and MMIC applications and they have become well recognized for their superior low noise and high frequency performance.

The use of pulse doping in the HEMT epitaxial structure was first disclosed at the IEEE Cornell conference on high speed devices in Aug. 1983 (Lee 1983), in the context of the GaAs/AlGaAs HEMT device. In that case the heterojunction interface containing the inversion channel was formed between GaAs and AlGaAs materials. In a later publication (Rosenberg 1985), a strained layer of InGaAs was employed at the heterojunction with GaAs both above and below the quantum well. Then in 1987, Morkoc and coworkers patented the Pseudomorphic HEMT structure, which is the structure reported by Rosenberg but with the GaAs above the quantum well replaced by $Al_xGa_{1-x}As$.

The pseudomorphic transistor structure has been very successful in producing microwave transistors that operate well into the multi-gigahertz regime, initially being used extensively in military systems and now finding their way into commercial products, particularly in the area of cellular communications. There has been a growing interest in combining the PHEMT with optical capability because of the difficulty in propagating very high frequency signals to and from the integrated circuit by coaxial lines. Combining electronic with optoelectronic components monolithically gives rise to the concept of the optoelectronic integrated circuit (OEIC). However, there are serious problems encountered because of the dissimilar nature of the structures of the FET, the pn junction laser and the MSM or PIN diode. To achieve this goal it has been proposed to change the structure by modifying the growth between the quantum well and the interface to enable an ohmic contact instead of a Schottky contact (see U.S. Pat. No. 4,800,415). In this patent, the PHEMT growth structure is modified in the region between the modulation doping and the semiconductor surface and the doping is proposed to be substantially p-type in order to provide a low resistance ohmic contact for the gate of the FET. However, this high doping creates a problem in the formation of the vertical cavity laser because of the effects of free carrier absorption. It also creates a problem in forming depletion-type FETs by implanting n-type dopant, i.e., compensating a large p density with a large n density to obtain a lower p density is difficult to control in a bulk region but much easier in a delta doped region. It makes control of the enhancement threshold difficult too, because the input capacitance is a function of doping which is harder to control than layer thickness. Another problem with this doping scheme is in producing effective current funneling for the laser to direct the current flow into the region of stimulated emission. It is very desirable to create a pn junction by N type implantation to steer the current in this structure since this would be compatible with the overall approach to building the FET devices. The heavy p doping makes it difficult to create junction isolation that is low leakage.

SUMMARY OF THE INVENTION

It is therefore an object of the invention to provide a single layer structure which can be used to realize within a single integrated circuit chip a wide range of optoelectronic devices (including lasers, detectors, FET devices, bipolar transistor devices, waveguide devices).

Another object of this invention is to devise a fabrication sequence to realize all these components simultaneously in a vertical cavity format for the optoelectronic devices. This fabrication sequence preferably minimizes the number of steps and preferably produces the minimum height final structure to maximize manufacturing yield.

It is a further object of this invention to achieve these goals with a unique combination of planar sheet dopings which modify the generic PHEMT structure and provide it with optoelectronic capability.

An additional object of this invention is to solve the problems of existing optoelectronic device manufacturing approaches and thereby provide for optimization of vertical cavity laser isolation, parasitic loss and FET threshold voltage.

In accord with these objects, which will be discussed in detail below, a semiconductor device structure and a fabrication technology are provided which meet these objectives which achieves vertical cavity laser and detector operation and FET operation within the same element. In accordance with one illustrative embodiment of the invention, the structure implements a field effect transistor device called a PHEMT where the gate contact is ohmic in nature as opposed to a Schottky diode. The ohmic contact is non-rectifying whereas the Schottky diode contact is rectifying to applied signals. Between the gate metal and the modulation doped layer of the PHEMT are two planar sheet charge doping layers both of opposite doping type (p type) to the modulation doped layer (n type). The top one at the surface enables a low resistance ohmic gate contact. The lower one, spaced below the top one by a specific thickness of charge neutral and essentially undoped wide bandgap semiconductor material and yet above the modulation doped layer of the PHEMT, defines the input capacitance of the field effect active device with respect to the modulation doped layer. The PHEMT itself is comprised of the modulation doped layer deposited upon a spacer layer of wideband material which is deposited on a small spacer of GaAs and then a series of barriers (GaAs) and wells ($In_xGa_{1-x}As$) all deposited on a sub-layer of GaAs. This modulation doped quantum well structure provides an inversion channel for the active devices described herein. An additional region of high doping of the same type as the modulation doped layer may be added below the PHEMT structure in the wideband gap waveguide cladding material to produce a pn junction. This structure implements a thyristor that can be configured to operate as a laser or a detector.

To form the inversion channel devices, source and drain electrodes are provided on either side of a refractory metal gate/emitter using ion implantation and standard self alignment techniques. The source and drain electrodes are metallized after a high temperature anneal which activates the implanted species. For the field effect transistor, the gate contact metal forms a uniform metal feature across the length (short dimension) of the device. For the optoelectronic devices (laser, detector, optical amplifier and modulator) the gate metal is opened to allow the passage of light either into or out of the active region and the surface P++ planar sheet doping is relied upon to produce a constant potential across the optical opening. Then the current flow from the gate metal contact into the active layer is a two dimensional funneling mechanism which is enabled by the use of a Si implant to steer the carrier flow. The optoelectronic devices are resonant vertical cavity devices and the spacing between the two planar doping p type layers is adjusted to produce a vertical cavity whose dimension is an integral number of half wavelengths.

The above embodiment produces optoelectronic devices that emit or detect normal to the surface. In another embodiment, the DBR mirrors of the vertical cavity perform as the cladding layers for a dielectric waveguide, and the light is entered into the edge of the device by means of a passive waveguide fabricated monolithically with these devices. This operation is particularly significant for the detector, modulator and amplifier devices.

Additional objects and advantages of the invention will become apparent to those skilled in the art upon reference to the detailed description taken in conjunction with the provided figures.

BRIEF DESCRIPTION OF THE DRAWING

FIGS. 2A–2H are schematic cross-sectional views of active device locations on the substrate after selected process steps during the fabrication sequence as follows:

FIG. 2A illustrates a schematic cross-sectional view of the active device locations after definition of alignment marks;

FIG. 2B illustrates a schematic cross-sectional view of the active device locations after the N-type ion implant that defines the optical aperture for optoelectronic devices;

FIG. 2C illustrates a schematic cross-sectional view of the active device locations after lift-off of a refractory metal layer (e.g., tungsten) that is used to form gate/emitter electrodes of the active devices;

FIG. 2D illustrates a schematic cross-sectional view of the active device locations after gate/emitter electrode definition and etch and Si ion implant that forms source and drain regions of the active devices;

FIG. 2E illustrates a schematic cross-sectional view of the active device locations after definition and etch that exposes the bottom DBR mirror stack for oxidation;

FIG. 2F illustrates a schematic cross-sectional view of the active device locations after definition and etch of collector contacts;

FIG. 2G illustrates a schematic cross-sectional view of the active device structure for the HFET optoelectronic device family (which includes the HFET laser, the HFET detector, the HFET amplifier, and the HFET modulator) realized from the multilayer structure of FIG. 1A; and FIGS. 2H(a) and 2H(b) illustrate schematic cross-sectional views of the active device structure for two exemplary HFET transistors realized from the multilayer structure of FIG. 1A; FIG. 2H(a) illustrates an enhancement-mode device (having a positive threshold voltage); FIG. 2H(b) illustrates a depletion-mode device (having a negative threshold voltage); note that the depletion-mode device of FIG. 2H(b) includes an n-type ion implant in the channel region, while the enhancement-mode device of FIG. 2H(a) does not include an n-type ion implant in the channel region.

FIGS. 3A–3D illustrate schematic cross-sectional views of a waveguide device formed on the substrate after selected process steps during the fabrication sequence as follows:

FIG. 3A illustrates a schematic cross-sectional view of the waveguide device just before the etching of the gate/emitter metal layer with the photoresist mask in place;

FIG. 3B illustrates a schematic cross-sectional view of the waveguide device after a window has been etched in the dielectric layer (e.g. $Si_3N_4$) and $SiO_2$ deposited for the purposes of vacancy free disordering;

FIG. 3C illustrates a schematic cross-sectional view of the waveguide device after the trench etch for the purpose of lateral oxidation of the mirror layers under the waveguide; and FIG. 3D illustrates a schematic cross-sectional view of the waveguide device after the final top mirror has been deposited over the structure.

DETAILED DESCRIPTION OF THE PREFERRED EMBODIMENTS

Figure 1A:
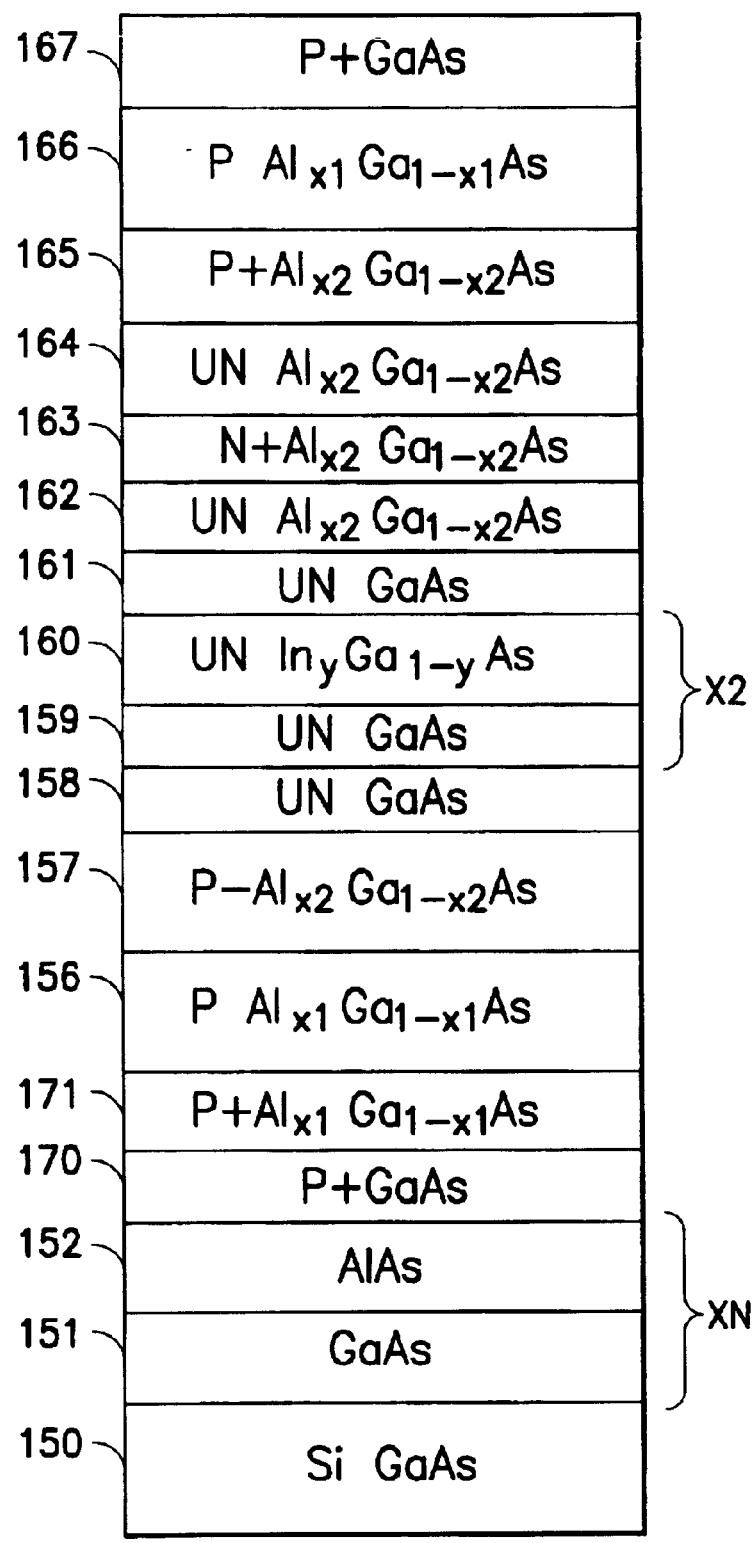
FIG. 1A is a schematic cross-sectional view showing the multi-layer sandwich in accordance with the present invention, from which the various electronic and optoelectronic devices described herein can be realized.

FIG. 1A shows the layers of a structure in accordance with an embodiment of the invention and from which all the device structures associated with the optoelectronic technology can be made. A first semiconductor layer 151 and a second semiconductor layer 152 are deposited in pairs upon a semi-insulating gallium arsenide substrate 150 in sequence to form a dielectric distributed bragg reflector (DBR) mirror. In the preferred embodiment, the layers 151 and 152 comprise GaAs and AlAs, respectively, and the AlAs layers 151 are subsequently subjected to high temperature steam oxidation to produce the compound $Al_xO_y$ so that a mirror will be formed at the designed center wavelength. Therefore the thickness of the GaAs layers 151 and the AlAs layers 152 are chosen so that the combined final optical thickness of each GaAs and $Al_xO_y$ layer pair is a quarter wavelength. Deposited upon the DBR mirror is the active device structure which begins with layer 170 of heavily doped GaAs of about 2000 Å thickness to enable the formation of ohmic contacts.

Figure 1B:
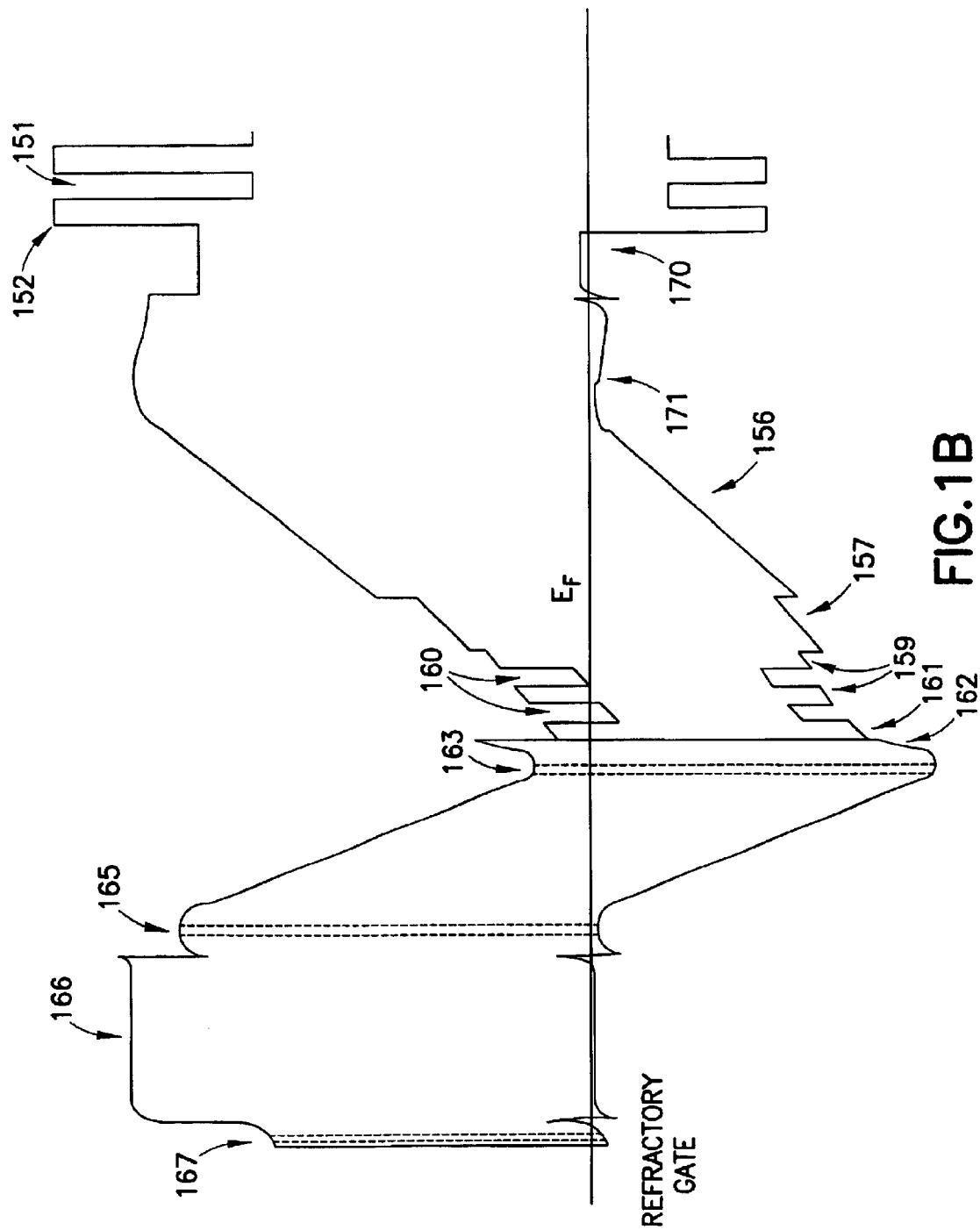
FIG. 1B shows the energy band diagram of the FIG. 1A structure.

In FIG. 1A this layer 170 is doped P+-type which results in superior performance of the HFET due to an optimized collector contact. Next layer 171 of P+-type $Al_{x1}Ga_{1-x1}As$ (typical thickness of 500–3000 Å) is deposited upon the contact layer 170 and this forms part of the lower cladding for the optical devices (an Al percentage of x1=0.7–0.8 and a doping level of $3 \times 10^{18}$ cm$^{-3}$ are typical). Layer 156 of P-type $Al_{x1}Ga_{1-x1}As$ with a doping of $10^{17}$–$10^{18}$ cm$^{-3}$ and a thickness of 1000–3000 Å is deposited next. Electrically, this layer 156 forms the p side of the pn junction for the transistor and it provides carrier confinement for the laser, amplifier and modulator structures. The combination of $Al_{x1}Ga_{1-x1}As$ layers 156 and 171 provide the optical cladding function for the lower waveguide for all laser, amplifier and modulator structures. Next layer 157 of $Al_{x2}Ga_{1-x2}As$ is deposited in which x2 is in the range 0.15–0.2, the thickness is about 500–1000 Å and the p doping is the background doping of about $10^{16}$ cm$^{-3}$ (which is found in typical epitaxial reactors). This layer 157 forms the lower separate confinement heterostructure (SCH) layer for the laser, amplifier and modulator devices. Next, layer 158 of undoped GaAs is deposited having a thickness of 100–300 Å to form a spacer layer. Then quantum wells are provided consisting of undoped well layers 160 (typical thickness of 60–100 Å) and undoped barrier layers 159 (typical thickness of 100 Å). In the illustrated embodiment, three quantum wells of strained InGaAs are used in layers 160 but unstrained wells are also possible. Above the quantum wells, an undoped spacer layer 161 of GaAs with a typical thickness of 20–40 Å is deposited. This layer 161 allows the adjustment of the epitaxial growth temperature from 530° C. as required for the growth of strained InGaAs layers to a temperature of 620° C. as desired for optical quality $Al_{x2}Ga_{1-x2}As$ layers that are subsequently formed. Next, a spacer layer 162 of undoped $Al_{x2}Ga_{1-x2}As$ is deposited (typically with a thickness of 20–30 Å), which functions as a setback layer for the modulation doping. On top of layer 162 there is deposited the modulation doped layer 163 which is also of alloy composition $Al_{x2}Ga_{1-x2}As$. Typically, the doping of layer 163 is in the range from $10^{17}$–$10^{18}$ cm$^{-3}$ and the thickness is in the range of 30–100 Å. In the preferred embodiment, the doping is $3.5 \times 10^{18}$ cm$^{-3}$ and the thickness is 80 Å. This layer 163 is constantly depleted in all useful modes of operation of the devices. The modulation doped layer 163 is followed by the undoped layer 164 of composition $Al_{x2}Ga_{1-x2}As$. This layer 164 serves as the input field effect capacitor layer for all the electronic devices such as the field-effect and bipolar devices. This layer 164 is often referred to as the gate spacer layer in the context of field-effect devices. The thickness of layer 164 affects the cutoff frequency of the device. For example, for a cutoff frequency of 40 GHz, a typical thickness of 300 Å would be used and for 90 GHz a typical thickness of 200 Å would be more appropriate. It is noted that the sequence of layers from 157 to 164 inclusive, form the structure that is referred to herein as the PHEMT transistor structure. For the optoelectronic device operation, layer 164 is the upper SCH region. Deposited upon layer 164 is a very thin (delta-doped) layer 165 of P+ type $Al_{x2}Ga_{1-x2}As$. Typical thickness and doping values are 60 Å and $10^{19}$ cm$^{-3}$. The doping species for this layer is preferably carbon (C) to ensure diffusive stability. In contrast to layer 163, layer 165 should never be totally depleted in operation. Layers 165 and 163 form the two plates of a parallel plate capacitor which forms the field-effect input to all devices. This planar carbon doped layer 165 represents the bottom p-type charge sheet that is being added to the PHEMT structure and is essential to the invention. Layer 166 is deposited on layer 165 and is the upper waveguide cladding layer for the laser, amplifier and modulator devices. This layer has the composition of $Al_{x1}Ga_{1-x1}As$ with a p-type doping level of $10^{17}$ cm$^{-3}$ and a thickness typically of 600–1000 Å. Layer 167 is the final layer in the epitaxial growth and is a very thin layer of GaAs of p++ type doping which is doped with the impurity C to extremely high levels to facilitate the formation of a low resistance ohmic contact. Typical values of thickness and doping of layer 167 are 100 Å and $10^{20}$ cm$^{-3}$, respectively. This planar doped carbon layer 167 represents the top p-type charge sheet that is being added to the PHEMT structure. The band diagram of the FIG. 1A structure is shown in FIG. 1B.

The composition of the quantum well layers 160 described above determines the emission wavelength of the lasers formed as the optical emission devices in this optoelectronic technology. What has been described is an approach to building a modulation-doped double heterostructure in a III–V materials system that enables the formation of lasers, detectors, modulators and transistors as part of an integrated circuit. Any combination of III–V materials is possible in which a quantum well with a narrow band gap may be grown epitaxially with surrounding layers of larger band gap all lattice matched to a starting substrate. For example, if the quantum wells are GaAs (and the barriers are AlGaAs) then the wavelength is around 850 nm. Whereas, if the quantum wells are grown as InGaAs layers with compressive strain, and the barriers are GaAs, then the wavelength may be varied from 920 nm to 1.1 microns depending upon the percentage of In incorporated in the growth. As the In content is increased, the maximum or critical thickness of the quantum well layer to avoid relaxation decreases. At the same time the energy gap of the layer decreases and the emission wavelength increases. The most important commercial wavelength in this range presently is 980 nm which is used as the pump source for erbium doped fiber amplifiers.

Another possibility for lattice matched material is obtained by incorporating some percentage of nitrogen (N) into the InGaAs layer to produce a layer of InGaAsN. It has been recently demonstrated that small amounts of N of the order of 2–5% may be incorporated to replace a similar fraction of the As atoms and thereby result in a reduction of the energy gap and thus an increase in the emission wavelength. Lasers with a wavelength of 1300 nm have been demonstrated and it is predicted that wavelengths up to 1600 nm are possible with the right combination of In (reduction of Ga) and N (reduction of As) and the appropriate degree of strain. The strain may be either compressive (which tends to increase the wavelength) or tensile (which tends to decrease the wavelength). These combinations allow the implementation of the optoelectronic device family described above with emission and detection at the commercially important wavelength of 1500 nm. Thus it enables the formation of modulators, switches, detectors, amplifiers and lasers together with FET electronics all at the wavelength of 1500 nm.

Another example of an important material system in which this device family could be realized is GaN. Ideally one could start with a GaN substrate to set the proper lattice parameter. However, it is difficult and costly to obtain such materials and various alternative have been developed including sapphire and SiC substrates. Achieving a well lattice matched substrate is a challenge. Assuming that the substrate is reasonably well matched, it is then possible to grow double heterostructures consisting of AlGaN for the cladding layers, GaN for the SCH layers and InGaN for the quantum well layers. Various other combinations can be considered.

To form resonant cavity devices, a dielectric mirror is deposited on this structure during the fabrication process. The distance between the mirrors is the thickness of all layers from 153 to 167 inclusive. In designing this structure, this thickness must represent an integral number of half-wavelengths at the designated wavelength, and the thickness of e.g. layer 166 is adjusted to enable this condition. The structure of FIG. 1A can be made, for example, using known molecular beam epitaxy techniques.

Figure 2A:
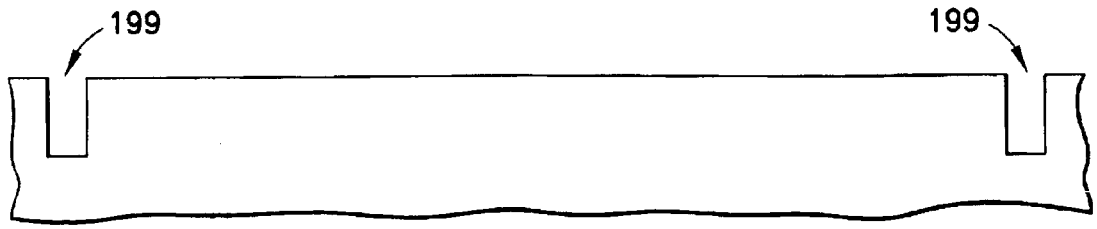
Figure 2B:
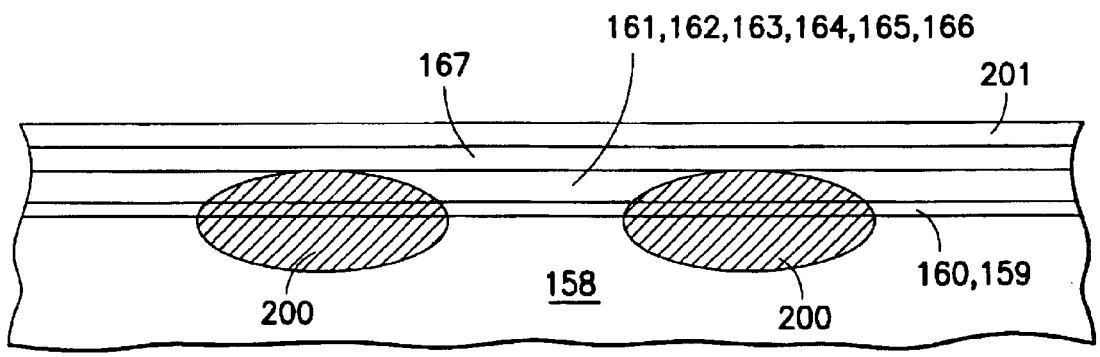
Figure 2C:
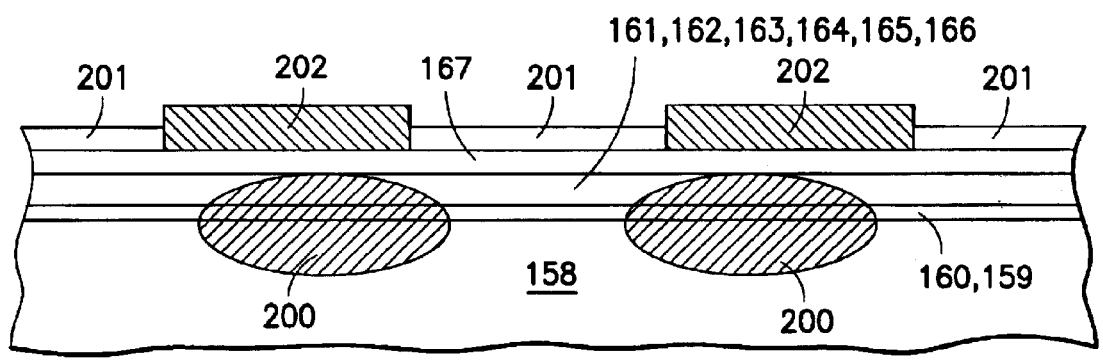
Figure 2D:
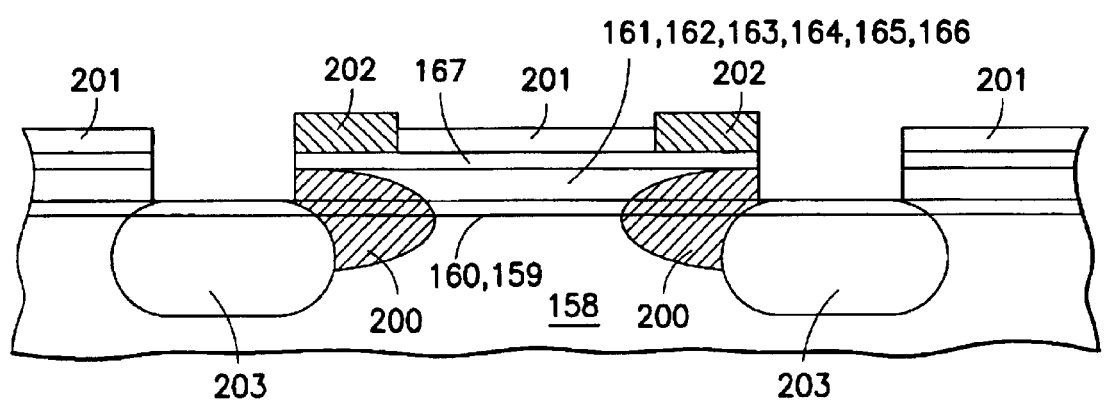
Figure 2F:
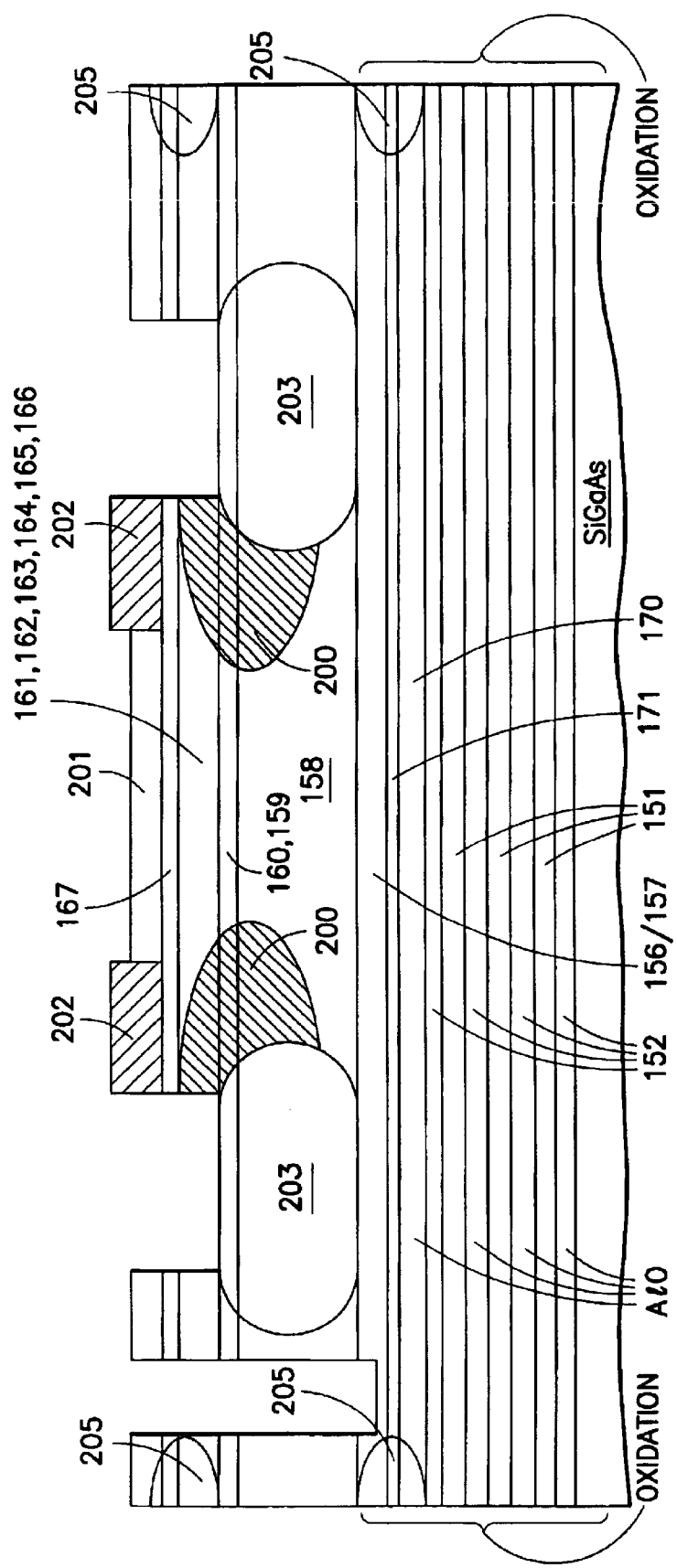
Figure 2G:
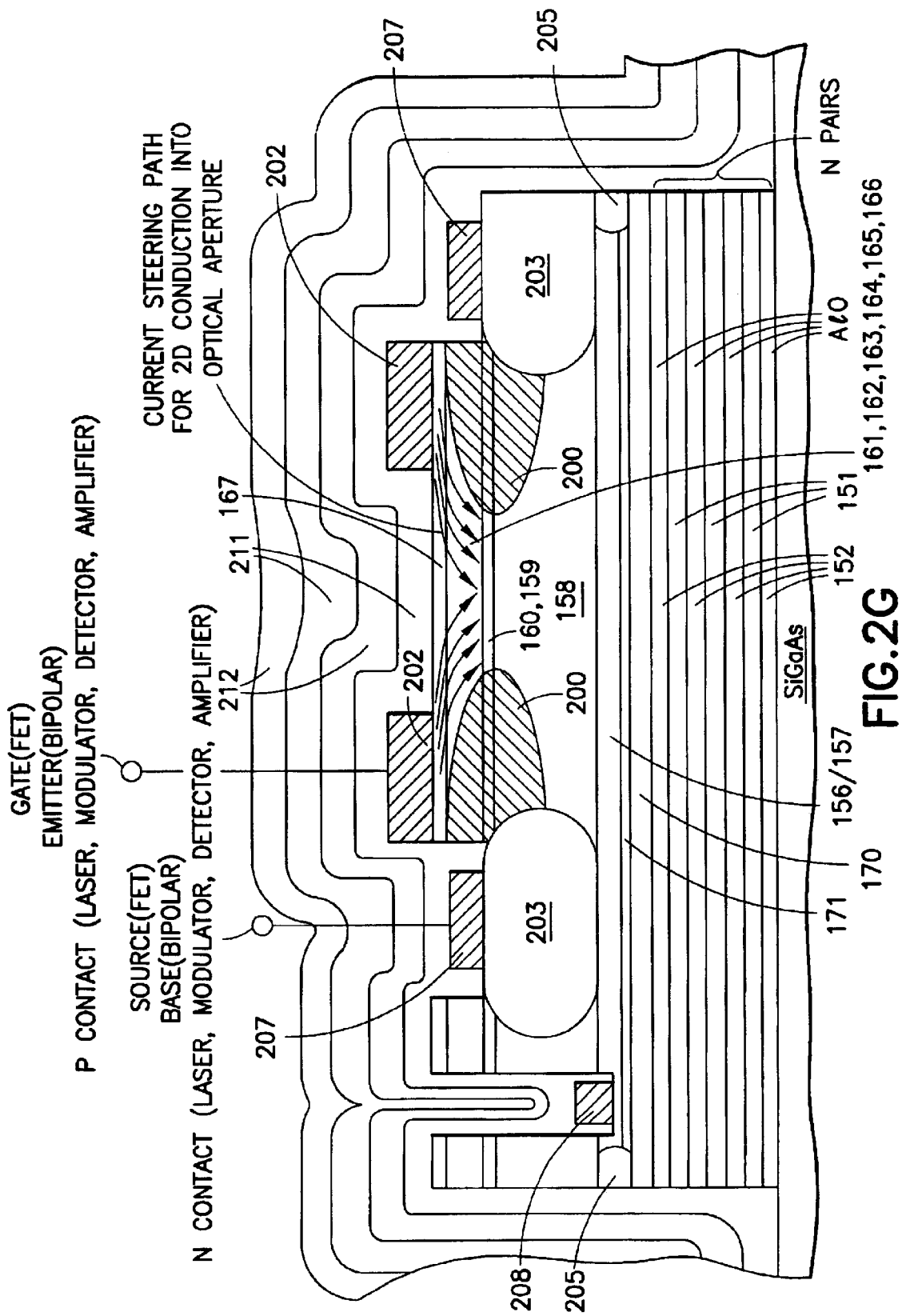
Figure 2H:
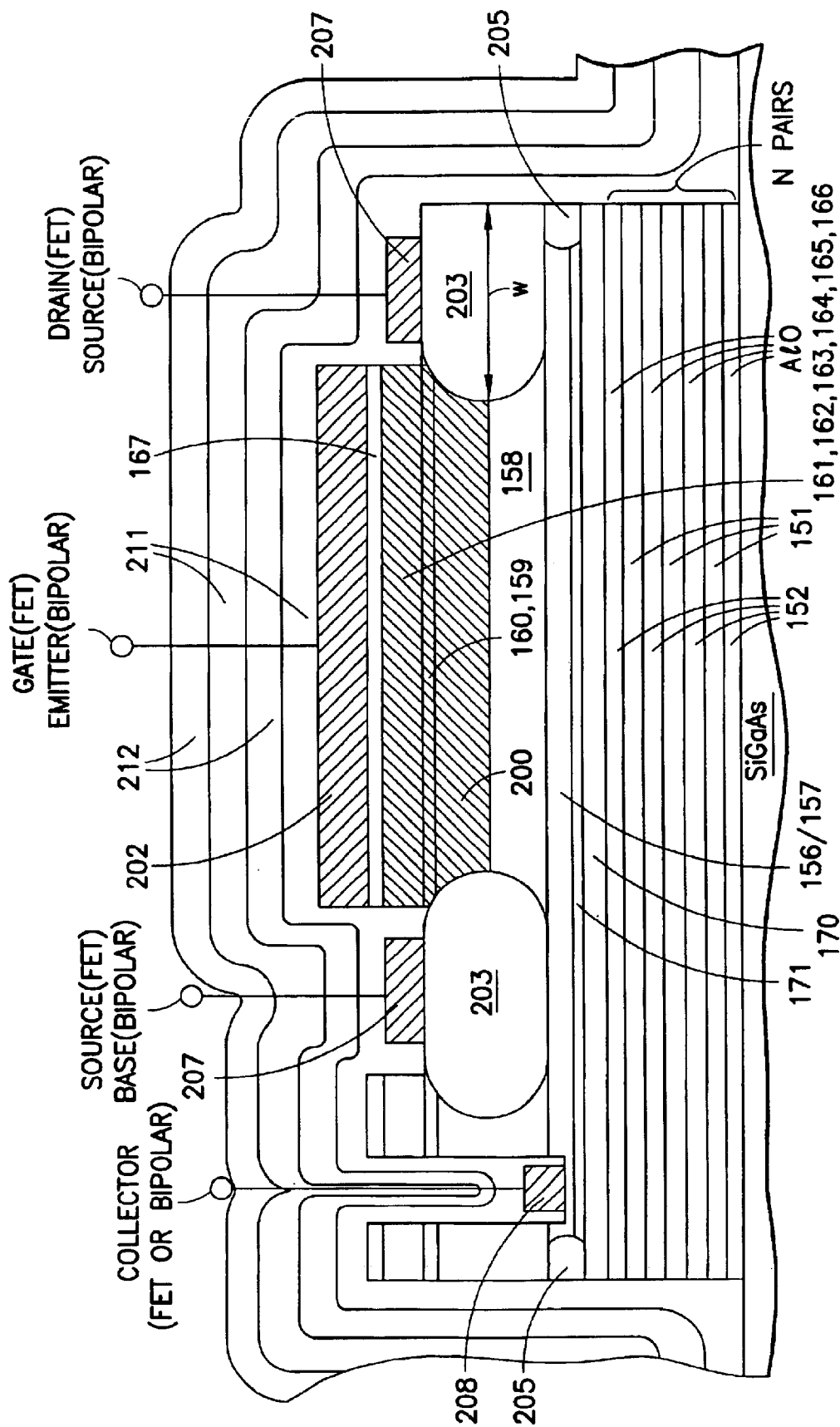

Using the multilayer structure described above with respect to FIGS. 1A and 1B, optoelectronic devices and transistors can be made in accordance with the sequence of steps shown in FIGS. 2A–2H. Device fabrication begins with the formation of alignment marks 199 by wet or dry etching as shown in FIG. 2A. Then, a dielectric layer 201 of silicon nitride ($Si_3N_4$) or other suitable dielectric material is deposited over the entire surface, and an N-type implant 200 is performed into some of the active device structures as shown in FIG. 2B. The ion implants 200 penetrate the dielectric layer 201 as shown. For example, the ion implants 200 are implanted for disposition under the gate electrode for current steering functions of optoelectronic devices as shown in FIG. 2G, and the ion implants 200 are implanted into the quantum well inversion channel (layers 159,160) and into the undoped spacer layer 158 for depletion-mode FET devices as shown in FIG. 2H(b). In the next step as shown in FIG. 2C, the optical apertures of the optoelectronic devices (e.g., lasers, detectors and modulators) are defined with photoresist, the nitride layer 201 is etched, and refractory metal 202 (such as tungsten) is lifted off to form the gate/emitter metal pattern. Alternatively, if the dielectric layer 201 is sufficiently thick to block a source-drain implant, then lift-off of the refractory metal may be avoided by using a direct patterning procedure for the gate/emitter metal layer. The opening in the gate/emitter metal layer (which corresponds to the optical aperture defined by the implants 200) is made somewhat larger than the separation between the implants 200 to minimize the effects of optical scattering at the metal edges. The next photomask defines the gate/emitter metal feature by protecting the metal layer 202 with photoresist where a feature is desired and etching the refractory metal. This gate/emitter metal feature 202 is a multifunctional electrode since it serves as the p-type emitter contact for the bipolar type transistors, as the p-type gate contact for the FET type transistors, and the p-type gate contact for the FET laser/detector/amplifier/modulator. These electrodes are labeled in FIGS. 2G and 2H(a) and 2H(b). Where there is no optical opening, a field-effect transistor is obtained and where there is an opening an optoelectronic device is formed. The photoresist may protect regions of the gate/emitter metal layer 202 or the nitride layer 201 shown in FIGS. 2D and 2E. With the photoresist still in place, N-type ions are implanted to create regions labeled 203 thereby forming low resistance contacts which are self-aligned to the inversion channel by the nature of the construction as shown in FIGS. 2D and 2E. The impurity type of the implant is N+ in order to supply electrons to the channel since the modulation doped layer 163 is also N type. As shown in FIG. 2F, the regions of the dielectric layer 201, which are disposed outside the channel contact implant regions 203, are etched to make contacts to the p-type layers 156/157/171/170 (which are subsequently metallized to form the collector terminal of the FET and bipolar transistor devices). After removal of photoresist, the wafer is then subjected to a rapid thermal annealing procedure which typically consists of a temperature of 950° C. for a time of 10 sec. This anneal has two functions which are to activate all ion implants and to perform disorder of selected areas in the formation of waveguides. To achieve selective disorder, sections of the dielectric layer 201 are replaced with oxide ($SiO_2$) as described in conjunction with FIGS. 3A–3D. The next step is to pattern the wafer to protect all active devices, and then perform a deep etch as shown in FIG. 2F. The etching is performed down to the GaAs substrate 150. The sample is then oxidized in a steam ambient to convert the mirror layers 152 of AlAs to mirror layers 152 of $Al_xO_y$, as shown in FIG. 2F. During this step, there is also lateral oxidation of $Al_{X2}$ layers to create oxide regions 205 which provides passivation of sidewall layers. However the collector contact regions remain unoxidized. Following the oxidation, metallization is performed wherein all of the N type regions are then contacted with N type alloy metal 207 (e.g., AuGe Ni/Au) and all of the P type regions are contacted with P type alloy metal 208 (e.g., AuZn Cr/Au) as shown in FIG. 2G. Both the N type and P type alloy metals are deposited preferably by lift-off techniques. In this metallization technique, openings are patterned in photoresist and the Au metal is deposited on the resist and in the openings. However other types of metal patterning which do not require lift-off are also possible and may be preferred to enhance yield in a manufacturing process. Then polyimide dielectric isolation is applied, contact holes are formed and lift-off of gold interconnect patterns is performed which also defines bonding pads. The final step is the deposition of the upper dielectric mirror comprised of alternating layers of low refractive index material 211 (such as $SiO_2$) and high refractive index material 212 (such as GaAs) as shown in FIGS. 2G and 2H(a) and 2H(b). Holes would then be etched through these layers to make contact to the bonding pads.

At this stage several different types of devices have been created and these are shown by the final cross-sections in FIGS. 2G and 2H(a) and 2H(b). FIG. 2G shows the cross-section of the HFET laser, the HFET detector, the HFET optical amplifier and the HFET modulator. It is to be emphasized that the identical structure performs as all of these optoelectronic devices depending upon the biases applied to the terminal nodes. As shown, the current steering implants 200 are placed to optically confine the vertically propagating mode, which it does in two ways. First, the implants 200 guide electrical p-type carriers from the refractory gate contact 202 into the section of active channel of layers 160, 159 that are positioned between the implants 200, and this is indicated by the arrows which show the conduction path. The arrows indicate a two dimensional conduction path for positive carriers. The major portion of implant 200 lies in the regions 166 and 158 which are the wide bandgap cladding layers. For gate to source voltages less than the built-in voltage (typically 2V) of these layers, there will be no conduction into regions 200 but instead the carriers will be funneled into the active layer along the current steering path as defined by the arrows. Therefore the implants allow the metal contact to be displaced away from the optical aperture, so that in the case of the laser for example, photons can only be produced in the quantum well section between the implants. Second, the implanted sections are slightly lower in index so that optical propagation in the cavity is guided into the region between the implants.

One of the most important devices realized by the structure of FIG. 2G is the laterally injected vertical cavity surface emitting laser (VCSEL). In the operation of the laser, there is a strong forward bias applied between the gate (202) and the source (207) terminals so that the electrons from the source populate the channel simultaneously with holes injected from the gate and lasing takes place either as a vertical cavity device or as an edge emitter. For the vertical cavity operation, the cavity is formed by the top and bottom DBR mirrors as already described whereas for the edge emitting operation, the cavity is formed by cleaved facets. However, if the reflectivity of the device as an edge emitter is made very small, then the operation of an optical amplifier is obtained. On the other hand, if a moderate forward bias is applied between the gate (202) and the source (207) terminals, only electrons populate the channel and then the device performs as a modulator with a high on/off ratio. The optical amplifier also can be considered to perform as a modulator in which there is internal gain to compensate for the insertion and absorptive losses of the device. If a reverse bias is applied between the source (207) and gate (202) terminals, then electron and holes in the channel are separated to the source and gate respectively and the device is a detector with either resonant cavity features or waveguide features. What has been accomplished is to adapt the electrode potentials of the source (207), gate (202) and collector (208) terminals so that when light is admitted through the top DBR mirror and the optical aperture formed by the ion implant 200 or through the bottom DBR mirror, then resonant absorption may take place in the quantum well inversion channel resulting in the production of electron-hole pairs such that the electrons are conducted to the source contacts (207), and the holes are conducted to the gate contact (202) or the collector contact (208) depending upon the relative potentials of the collector and the gate. With this operation, the function of the resonantly enhanced optical detector is obtained since the absorption in a single quantum well is greatly increased by the cavity resonance. It is advantageous to reduce the width (W) of implant regions 203 to reduce diode capacitance and improve speed.

FIGS. 2H(a) and 2H(b) illustrate the active device structure for two exemplary HFET transistors realized from the multilayer structure of FIG. 1A. FIG. 2H(a) illustrates an enhancement-mode device (having a positive threshold voltage). FIG. 2H(b) illustrates a depletion-mode device (having a negative threshold voltage). Note that the depletion-mode device of FIG. 2H(b) includes an n-type ion implant (shown with single hatching) in the channel region, while the enhancement-mode device of FIG. 2H(a) does not include an n-type ion implant in the channel region. The HFET is the fundamental device produced by this technology and is unique because it employs an ohmic gate contact with a modulation doped structure. The source, drain and gate contacts are used conventionally and the collector is connected as a back gate similar to the substrate contact in a silicon-based MOSFET transistor. In this case, the collector contact, the source and drain contacts and the gate contact are required. The drain dimension (W) in FIGS. 2H(a) and 2H(b) is minimized by the trench etch to reduce capacitance. If the source and gate potentials are maintained at less than about 1.6V which is the cut-in voltage of the thermionic conduction from the emitter to the collector, then the operation is limited to that of the field effect transistor. This structure also functions as a bipolar transistor by using the gate metal electrode as an emitter terminal, the two source electrodes on either side of the channel as the control terminal (this is the base in a conventional bipolar transistor), and the collector electrode as the traditional collector terminal in a bipolar transistor. When the emitter to collector voltage is increased above the threshold for thermionic emission over the modulation doped barrier, then bipolar transistor action is obtained whereby the injection of current into the control terminal modulates the thermionic current between the emitter and the collector. This bipolar device eliminates the conventional neutral base region and replaces it with an inversion channel. The advantages are the elimination of recombination and scattering in the base region and the base transit time.

Figure 3C:
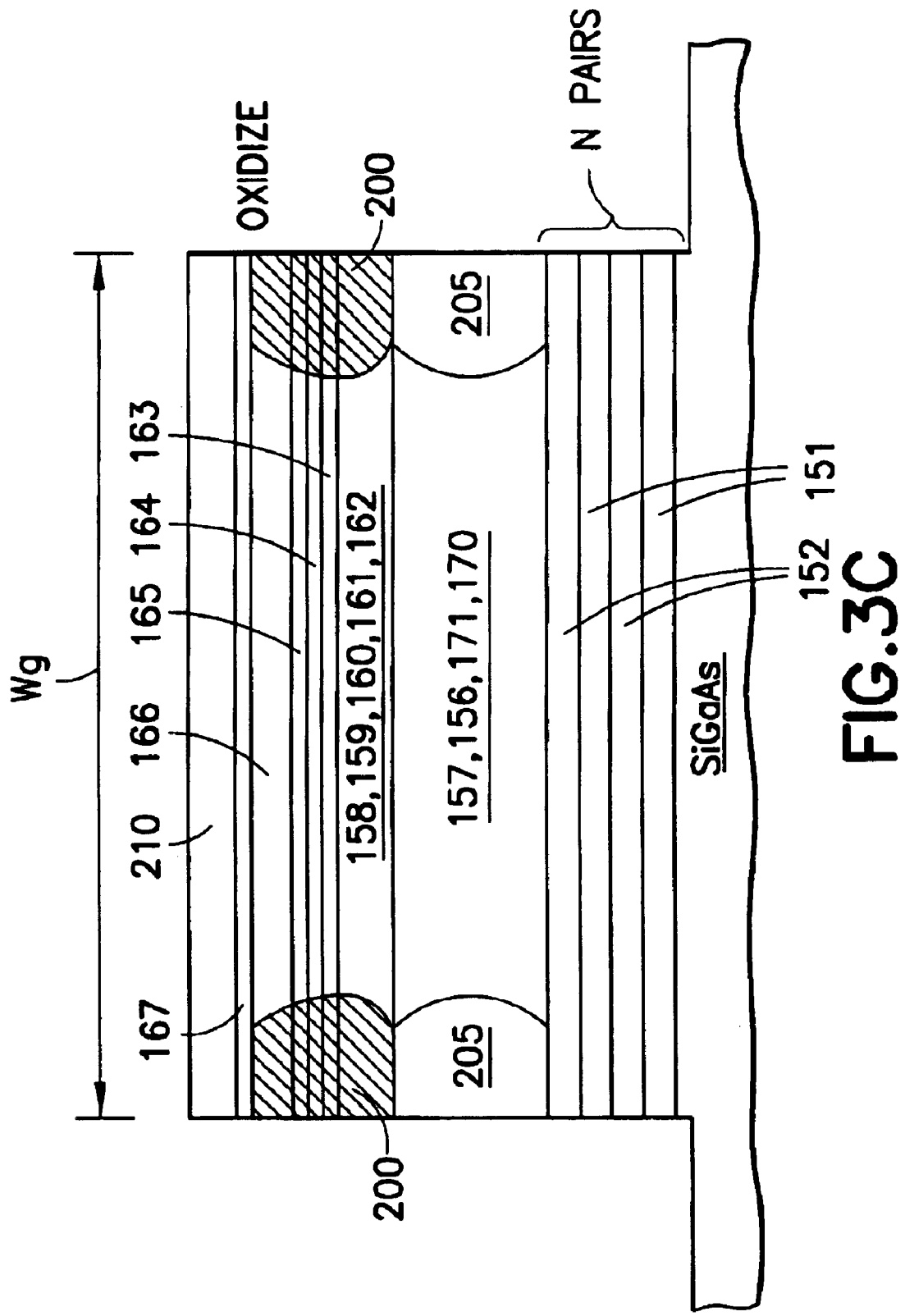
Figure 3D:
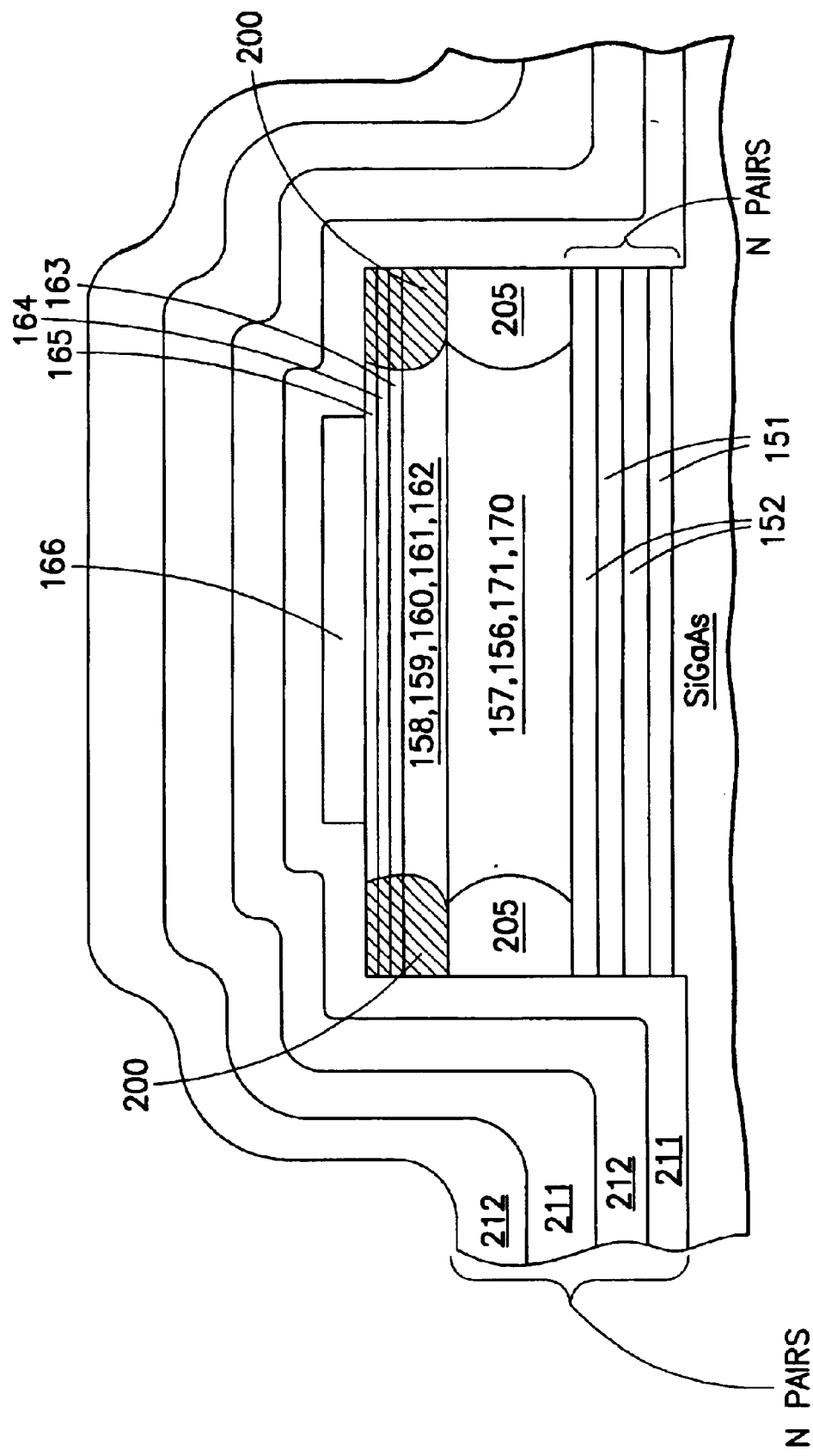

The fabrication procedure of FIGS. 2A–2F also produces waveguides as shown in FIGS. 3A–3D. FIG. 3A shows the cross-section after the lift-off of gate/emitter metal layer 202 but before etching it. The implants 200 used in the active devices and shown in FIG. 2B are also used here to provide optical confinement in the waveguide core. The spacing between the implants 200 will be slightly smaller than the final waveguide pattern. In FIG. 3B, the waveguide area has been defined by etching the dielectric region 201 and depositing an oxide layer 210 (e.g., $SiO_2$) to cover the waveguide core region (whose lateral dimension x is shown in FIG. 3A) and the regions external to the waveguide (whose lateral dimension y as shown in FIG. 3B) where the gate/emitter metal layer 202 was etched away. However, it is important to note that dimension y is larger than the final waveguide dimension $w_g$ as shown in FIG. 3C. The final waveguide dimension $w_g$ will be placed inside this region such that $x<w_g$ and $x<y$. The next step is a rapid thermal annealing operation. In this step, the regions covered with oxide layer 210 experience Impurity Free Vacancy Disordering (IFVD) which increases the bandgap locally to substantially eliminate absorption in the guided region. The regions covered with dielectric layer 201 show essentially no effects of IFVD. FIG. 3C shows the passive waveguide after trench etch and the oxidation which shows the outer extremities of the guide which are formed by the air interface. However the main guiding action is achieved by the presence of the oxidized $Al_xO_y$ sections 205 produced by lateral oxidation during the oxidation procedure and by the implanted regions 200 as discussed above. At this stage, the oxide layers 210 and dielectric layers 201 are removed and the P+ surface layer 167 is etched away. Then the final waveguide pattern is used and the material outside the waveguide core is etched down to the P+ charge sheet layer 165. Therefore the etch is stopped at a typically distance of 300–400 Å above the quantum wells in which the maximum optical intensity resides. After this, the top DBR dielectric layers 211 an 212 are applied in the form of a stack as a final waveguide cladding layer. Note that the polyimide layer is not to be used in the waveguide structure. Thus the final waveguide is a double ridge structure in which a shallow rib of the order of 1000 Å defines the internal core dimension and a much larger rib of a depth about 2 $\mu$m defines the outer extremities of the guide. By design very little of the optical energy will penetrate to the external boundaries.

There has been described and illustrated herein a layer structure and methods for fabricating an integrated circuit device which allows for one or more of FET and bipolar transistors, optical emitters, optical detectors, optical modulators, optical amplifiers and other optoelectronic devices utilizing an inversion channel created by modulation doping. While particular embodiments of the invention have been described, it is not intended that the invention be limited thereto, as it is intended that the invention be as broad in scope as the art will allow and that the specification be read likewise. Thus, while particular layers have been described with particular thicknesses and with particular types and strengths of dopings, it will be appreciated that certain transition layers could be removed and/or additional layers and/or sublayers could be utilized, and further that the layers could have different thicknesses and be differently doped. Also, while particular layers have been described with reference to their percentage content of certain constituents, it will be appreciated that the layers could utilize the same constituents with different percentages, or other constituents. In particular, any combination of III–V materials is possible in which a quantum well with a narrow band gap may be grown epitaxially with surrounding layers of larger band gap all lattice matched to a starting substrate.

Additionally, while particular formation and metallization techniques have been described, it will be appreciated that the described structures can be formed in other manners, and other metals used to form terminals. Further, while particular arrangements of bipolar and FET transistors, optical emitters, detectors, modulators, amplifiers, etc. formed from the described semiconductor structure have been described, it will be appreciated that other devices may be formed from the provided structure and components. Moreover, while the invention was described as providing a monolithic layer structure from which different semiconductor elements can be implemented together, it will be appreciated that the invention pertains to utilizing the layer structure regardless of whether a chip utilizing the structure utilizes only a single technology (e.g., FETS), or whether multiple technologies (e.g., lasers, detectors, optical amplifiers, modulators, FETs, and bipolar transistors) are utilized together on the chip. At the same time, while the drawings only show a single element, it will be appreciated that chips utilizing the invention may include millions of horizontally laid-out elements, including one or more of the listed technologies. It will therefore be appreciated by those skilled in the art that yet other modifications could be made to the provided invention without deviating from its spirit and scope as claimed.

What is claimed is:

1. A semiconductor device comprising:
   a) a series of layers formed on a substrate, said layers including a first plurality of layers, a second plurality of layers formed above said first plurality of layers, and at least one undoped spacer layer formed above said second plurality of layers, wherein said first plurality of layers form a first distributed bragg reflector mirror and said second plurality of layers form at least one quantum well;
   b) at least one pair of first n-type ion implant regions with a vacancy-disordered waveguide region therebetween, said waveguide region having minimal absorption loss and contributing to lateral confinement of light therein.

2. A semiconductor device according to claim 1, wherein: said second plurality of layers form a modulation doped quantum well structure that includes an n-type modulation doping layer.

3. A semiconductor device according to claim 2, further comprising:
   a p-contact metal layer formed over said modulation doped quantum well structure;
   second n-type ion implant regions that are electrically coupled to said modulation doped quantum well structure, and
   an n-contact metal layer formed on second n-type implant regions to realize an HFET device from said series of layers.

4. A semiconductor device according to claim 3, further comprising:
   a p-contact layer metal layer that is electrically coupled to at least one p-type layer disposed below said second plurality of layers to realize a collector electrode of said HFET device.

5. A semiconductor device according to claim 3, wherein: said HFET device is an enhancement-mode FET device.

6. A semiconductor device according to claim 3, wherein: an n-type ion implant region implanted into said modulation doped quantum well structure to realize a depletion-mode FET device.

7. A semiconductor device according to claim 3, wherein: said waveguide region is part of an optical waveguide structure with sidewalls; and
   sidewalls of said HFET device are formed from the same etching operation that forms said sidewalls of said optical waveguide structure.

8. A semiconductor device according to claim 7, further comprising:
   oxidized sections along said sidewalls of HFET device.

9. A semiconductor device according to claim 2, further comprising:
   a p-contact metal layer formed over said modulation doped quantum well structure,
   second n-type ion implant regions that are electrically coupled to said modulation doped quantum well structure,
   an n-contact metal layer disposed on said second n-type ion implant regions, and
   a p-contact layer metal layer that is electrically coupled to at least one p-type layer disposed below said second plurality of layers,
   to thereby realize a bipolar-type transistor device from said series of layers.

10. A semiconductor device according to claim 9, wherein: said waveguide region is part of an optical waveguide structure with sidewalls; and
    sidewalls of said bipolar-type transistor device are formed from the same etching operation that forms said sidewalls of said optical waveguide structure.

11. A semiconductor device according to claim 10, further comprising:
    oxidized sections along said sidewalls of said bipolar-type transistor device.

12. A semiconductor device according to claim 1, further comprising:
    c) sidewalls with oxidized sections along said sidewalls; and
    d) a plurality of layers disposed over said waveguide region to form a top distributed bragg reflector mirror, to thereby realize an optical waveguide structure.

13. A semiconductor device according to claim 12, wherein:
    said series of layers further comprises an undoped spacer layer and at least one p-type layer formed between said first plurality of layers and said second plurality of layers.

14. A semiconductor device according to claim 13, wherein:
    said sidewalls of said optical waveguide structure extend down through said undoped spacer layer and said at least one p-type layer formed between said first plurality of layers and said second plurality of layers.

15. A semiconductor device according to claim 13, wherein:
    said undoped spacer layer formed between said first plurality of layers and said second plurality of layers comprises GaAs.

16. A semiconductor device according to claim 13, wherein:
said at least one p-type layer formed between said first plurality of layers and said second plurality of layers includes a plurality of p-type AlGaAs layers formed on a layer of P+-type GaAs.

17. A semiconductor device according to claim 12, wherein:
said sidewalls of said optical waveguide structure extend down through said first plurality of layers into said substrate.

18. A semiconductor device according to claim 1, wherein:
said first n-type ion implant regions penetrate to at least said second plurality of layers.

19. A semiconductor device according to claim 1, further comprising:
at least one p-type layer formed over said undoped spacer layer, said at least one p-type layer comprising a p-type charge sheet layer, a p-type cladding layer, and a p-type ohmic contact layer.

20. A semiconductor device according to claim 19, wherein:
portions of said p-type ohmic contact layer over said waveguide region are removed.

21. A semiconductor device according to claim 19, wherein:
said p-type charge sheet layer comprises AlGaAs of P+-type doping;
said p-type cladding layer comprises of AlGaAs of modest P type disposed on said p-type charge sheet layer; and
said p-type ohmic contact layer comprises GaAs of P++ type doping disposed on said p-type cladding layer.

22. A semiconductor device according to claim 1, further comprising:
second n-type ion implant regions that define an optical aperture for at least one optoelectronic device, said second n-type ion implant regions formed by the same implant operation that forms said first n-type ion implant regions.

23. A semiconductor device according to claim 22, wherein:
said second n-type ion implant regions provide a current steering path and two dimensional conduction for positive carriers into an active area of said optoelectronic device.

24. A semiconductor device according to claim 22, further comprising:
a p-contact metal layer formed over said second n-type implant ion regions,
third n-type ion implant regions that are electrically coupled to said modulation doped quantum well structure, and
an n-contact metal layer formed on third n-type ion implant regions, to thereby realize a resonant vertical cavity optoelectronic device from said series of layers.

25. A semiconductor device according to claim 24, further comprising:
a p-contact layer metal layer that is electrically coupled to at least one p-type layer disposed below said second plurality of layers.

26. A semiconductor device according to claim 24, wherein:
said resonant vertical cavity optoelectronic device comprises one of a laser, detector, modulator, and amplifier.

27. A semiconductor device according to claim 24, wherein:
said waveguide region is part of an optical waveguide structure with sidewalls; and
sidewalls of said resonant vertical cavity optoelectronic device are formed from the same etching operation that forms said sidewalls of said optical waveguide structure.

28. A semiconductor device according to claim 27, further comprising:
oxidized sections along said sidewalls of said resonant vertical cavity optoelectronic device.

29. A semiconductor device according to claim 1, wherein:
said series of layers comprise group III–V material.

30. A semiconductor device according to claim 1, wherein:
said first plurality of layers comprise a plurality of layer pairs of GaAs and AlAs, respectively, wherein said AlAs is oxidized to form said distributed bragg reflector mirror.

31. A semiconductor device according to claim 1, wherein:
said second plurality of layers comprise a plurality of quantum wells of strained InGaAs separated by GaAs barrier material.

32. A semiconductor device according to claim 1, wherein:
said second plurality of layers comprise a modulation doped layer of n-type AlGaAs.

33. A semiconductor device according to claim 1, wherein:
said undoped spacer layer comprises AlGaAs.

34. A semiconductor device according to claim 33, wherein:
said undoped spacer layer has a thickness between 200 Å and 300 Å.

35. A semiconductor device according to claim 1, wherein:
said series of layers are formed utilizing molecular beam epitaxy.

36. A multifunctional waveguide device constructed in an epitaxially grown III–V quantum well semiconductor structure in which two separated metal electrodes form gate/emitter contacts to a top layer with P++ type conductivity thereby defining a waveguide rib and a quantum well channel extending across said rib and simultaneously an optical opening between said metal electrodes to accommodate an optical mode propagating in said waveguide but such that said electrodes are connected electrically by said top layer, the conduction of hole type carriers from said gate/emitter contacts being guided into the quantum wells directly below the optical opening by the presence of N+ type implants directly underneath said metal electrodes and in which a second type of metal contact is applied on either or both sides of said waveguide rib to form low resistance source contacts to source regions formed by ion implantation with N type ions, said ion implanted regions being rapidly thermally annealed to form pn junctions with p type epitaxial layers below said quantum wells and said p type layers forming a collector region which is contacted by a collector contact to permit the flow of holes and the adjustment of the potential of said collector region, said thermally annealed regions being self-aligned to said gate/emitter contacts and forming low resistance N+ type contacts for transfer of charge into and out of said channel, the voltages applied between said source and gate/emitter contacts controlling the flow of charge into and out of said channel, the length of said waveguide device being defined by a very slight change in energy gap and therefore reflectivity at its boundaries to passive waveguide sections using a fabrication technique like impurity free vacancy disordering such that guided optical waves make only a single pass through said waveguide length due to the low reflectivity, said waveguide device performing as either a laterally accessed optical detector in which photogenerated holes are removed to said gate/emitter contacts or said collector contact and photogenerated electrons are removed to said source contacts, an optical modulator in which electrons are injected into said channel and holes are injected into said collector contact and said gate/emitter contacts causing a substantial shift in absorption edge and a large change in refractive index of said quantum wells, or as an optical amplifier in which stimulated emission occurs in said quantum wells due to electrons injected from said source contacts and holes injected from said gate/emitter contacts as the voltage applied between said source and gate/emitter contacts and therefore channel charge concentration is increased, the material layer structure for said waveguide device comprising an epitaxially grown distributed bragg reflector mirror; a first layer of P+ type GaAs deposited on said epitaxial mirror; a layer of P type AlGaAs of high Al concentration; a PHEMT transistor epitaxial layer structure using N type modulation doping, said PHEMT consisting of a layer of aluminum gallium arsenide, a layer of GaAs of 100–300 Å, at least one quantum well surrounded by barriers, a spacer layer of aluminum gallium arsenide, a modulation doped layer of aluminum gallium arsenide and a gate spacer layer of aluminum gallium arsenide of thickness 200–300 Å; a planar doped layer of P+ type aluminum gallium arsenide disposed on said gate spacer layer; a cladding layer of aluminum gallium arsenide of modest P type doping disposed on said planar doped layer; a top layer of GaAs of P++ type doping disposed on said cladding layer to realize said top layer as a low resistance contact to said gate/emitter contacts.

37. A multifunctional waveguide device as described in claim 36, wherein said at least one quantum well comprises one of InGaAs and InGaAsN and said barriers comprises GaAs, wherein the concentrations of In and N are chosen to maintain a lattice match to underling layers, including a GaAs substrate, by producing zero strain, compressive strain or tensile strain, and also chosen such that wavelengths in either in a range of 0.9 μm to 1.1 μm when the quantum well is InGaAs or in a range of 1.25 μm to 1.6 μm when the quantum well is InGaAsN, are available for the emission, detection, amplification and modulation of light in said wavelength range.

38. The waveguide device as described in claim 36, with the active layer in the PHEMT portion of said structure comprised of quantum wells of InGaAsN and barriers of GaAs with the concentrations of In and N chosen to maintain a lattice match to underling layers, including a GaAs substrate, by producing zero strain, compressive strain or tensile strain, with one of said gate/emitter contacts configured as the gate of a field effect transistor and said source contacts configured as the source and drain of a field effect transistor so that operation as an electronic device integrated with said multifunction waveguide device is possible.

39. The waveguide device as described in claim 36, with the active layer in the PHEMT portion of said structure comprised of quantum wells of InGaAsN and barriers of GaAs with the concentrations of In and N chosen to maintain a lattice match to underling layers, including a GaAs substrate, by producing zero strain, compressive strain or tensile strain, with one of said gate/emitter contacts configured as the emitter of a bipolar field effect transistor, one of said source contacts configured as the input, control electrode or virtual base of a bipolar field effect transistor and said collector contact performing as the collector node of bipolar field effect transistor so that operation as an electronic device integrated with said multifunction waveguide device is possible.

40. The waveguide device as described in claim 36, wherein an electronic device is integrated with said multifunction waveguide device, the electronic device comprising at least one of: a field effect transistor wherein one of said gate/emitter contacts is configured as the gate of said field effect transistor and said source contacts are configured as the source and drain of said field effect transistor; and a bipolar field effect transistor with one of said gate/emitter contacts configured as the emitter of said bipolar field effect transistor, one of said source contacts configured as the base of said bipolar field effect transistor and said collector contact performing as the collector of said bipolar field effect transistor.

41. A passive waveguide structure formed from an epitaxial layer structure consisting of a layer of aluminum gallium arsenide, a layer of GaAs of 100–300 Å, at least one quantum well of strained InGaAs surrounded by GaAs barriers to provide emission wavelengths in the range of 0.9 μm, a spacer layer of aluminum gallium arsenide, a modulation doped layer of aluminum gallium arsenide and a gate spacer layer of aluminum gallium arsenide of thickness 200–300 Å; a planar doped layer of P+ type aluminum gallium arsenide disposed on said gate spacer layer; a cladding layer of aluminum gallium arsenide of modest P type doping desposed on said planar doped layer; a layer of GaAs of P++ type doping disposed on said cladding layer, wherein said P++ layer is etched away, achieving lateral confinement by virtue of N type implants and the oxidation of Al rich layers to produce $Al_xO_y$ compounds along the sidewalls of the rib of said waveguide, utilizing impurity free vacancy disordering which is achieved by the deposition and rapid thermal anneal of an $SiO_2$ layer.

* * * * *